(12) United States Patent
Zhang

(10) Patent No.: US 11,601,600 B2
(45) Date of Patent: Mar. 7, 2023

(54) CONTROL METHOD AND ELECTRONIC DEVICE

(71) Applicant: GUANGDONG OPPO MOBILE TELECOMMUNICATIONS CORP., LTD., Guangdong (CN)

(72) Inventor: Gong Zhang, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 29 days.

(21) Appl. No.: 17/173,762

(22) Filed: Feb. 11, 2021

(65) Prior Publication Data
US 2021/0168273 A1    Jun. 3, 2021

Related U.S. Application Data

(63) Continuation of application No. PCT/CN2019/090628, filed on Jun. 11, 2019.

(30) Foreign Application Priority Data

Aug. 13, 2018 (CN) .......................... 201810915437.6

(51) Int. Cl.
H04N 5/235 (2006.01)

(52) U.S. Cl.
CPC ......... H04N 5/2353 (2013.01); H04N 5/2351 (2013.01)

(58) Field of Classification Search
CPC .... H04N 5/2353; H04N 5/2351; H04N 5/351; H04N 5/3535; H04N 5/23229; H04N 5/2355; H01L 27/14621; H01L 27/14627
See application file for complete search history.

(56) References Cited

U.S. PATENT DOCUMENTS

| | | | |
|---|---|---|---|
| 2007/0273785 A1* | 11/2007 | Ogawa | H04N 9/0451 |
| | | | 348/E5.037 |
| 2009/0091645 A1 | 4/2009 | Trimeche et al. | |
| 2009/0226160 A1 | 9/2009 | Jang et al. | |
| 2011/0050937 A1 | 3/2011 | Huang | |

(Continued)

FOREIGN PATENT DOCUMENTS

| | | |
|---|---|---|
| CN | 101472076 A | 7/2009 |
| CN | 104104886 A | 10/2014 |

(Continued)

OTHER PUBLICATIONS

Extended European Search Report for EP Application 19849429.6 dated Sep. 13, 2021. (12 pages).

(Continued)

*Primary Examiner* — Jason A Flohre
(74) *Attorney, Agent, or Firm* — Young Basile Hanlon & MacFarlane, P.C.

(57) ABSTRACT

A control method in an imaging device is provided. The imaging device includes a pixel-cell array including a plurality of photosensitive pixel-units, each photosensitive pixel-unit of the photosensitive pixel-units includes at least two exposure pixels including at least one medium-exposure pixel. The method includes determining an ambient brightness level of a photographing environment; adjusting a first ratio to be a first value, in response to a brightness level of the photographing environment belonging to a high-level or a low-level, wherein the first ratio indicates a ratio of the at least one medium-exposure pixel in the each photosensitive pixel-unit; and adjusting the first ratio to be a second value, in response to the brightness level of the photographing environment belonging to a medium-level, wherein the low-level, the medium-level, and the high-level are in an ascending order, and the first value is greater than the second value.

18 Claims, 6 Drawing Sheets

Determining an ambient brightness level of a photographing environment ~ S101

Adjusting a first ratio to be a first value, in response to a brightness level of the photographing environment belonging to a high-level or a low-level, wherein the first ratio indicates a ratio of the at least one medium-exposure pixel in the each photosensitive pixel-unit ~ S102

Adjusting the first ratio to be a second value, in response to the brightness level of the photographing environment belonging to a medium-level, wherein the low-level, the medium-level, and the high-level are in an ascending order, and the first value is greater than the second value ~ S103

(56) References Cited

U.S. PATENT DOCUMENTS

| | | | |
|---|---|---|---|
| 2011/0050969 A1* | 3/2011 | Nishihara | H04N 5/357 348/308 |
| 2011/0176729 A1 | 7/2011 | Lee et al. | |
| 2011/0221933 A1 | 9/2011 | Yuan et al. | |
| 2015/0085077 A1 | 3/2015 | Kim | |
| 2015/0244916 A1* | 8/2015 | Kang | H04N 5/2353 348/222.1 |
| 2015/0350583 A1 | 12/2015 | Mauritzson et al. | |
| 2016/0119562 A1 | 4/2016 | Takase et al. | |
| 2019/0288020 A1* | 9/2019 | Ikuma | H04N 5/3559 |
| 2021/0193739 A1* | 6/2021 | Ogasahara | A61B 1/041 |

FOREIGN PATENT DOCUMENTS

| | | |
|---|---|---|
| CN | 105578065 A | 5/2016 |
| CN | 105592270 A | 5/2016 |
| CN | 105611185 A | 5/2016 |
| CN | 107463052 A | 12/2017 |
| CN | 108200354 A | 6/2018 |
| CN | 108322669 A | 7/2018 |
| CN | 109005346 A | 12/2018 |

OTHER PUBLICATIONS

Chinese First Office Action with English Translation of Chinese application No. 201810915437.6, dated Sep. 29, 2019 (12 pages).

International Search Report with English Translation of International application No. PCT/CN2019/090628, dated Aug. 27, 2019 (15 pages).

Notification to Grant Patent Right for Invention, with English Translation of Chinese application No. 201810915437.6, dated Jan. 22, 2020 (6 pages).

* cited by examiner

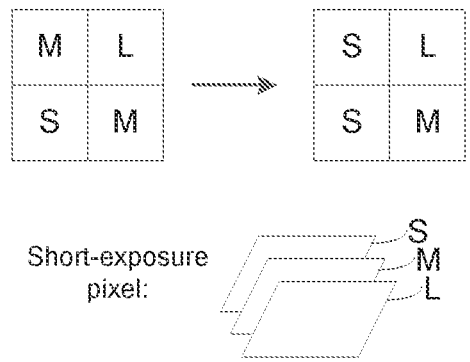

FIG. 6

```
Controlling the pixel-cell array to output original pixel      201
information, after adjusting the ratio of medium-exposure pixels
in each of the photosensitive pixel-units of the pixel-cell array Obtaining combined pixel information of each of the
photosensitive pixel-units according to the original pixel      202
information output by at least two exposure pixels in the same
photosensitive pixel-unit Performing imaging according to the combined pixel information   203
```

FIG. 7

CONTROL METHOD AND ELECTRONIC DEVICE

CROSS-REFERENCE TO RELATED APPLICATION(S)

This application is a continuation-application of International (PCT) Patent Application No. PCT/CN2019/090628, filed on Jun. 11, 2019, which claims priority of the Chinese patent application No. 201810915437.6, filed on Aug. 13, 2018, the entire contents of both of which are hereby incorporated by reference.

TECHNICAL FIELD

The present disclosure generally relates to the field of imaging technology, and particularly to a control method and an electronic device.

BACKGROUND

With continuous development of terminal technology, an increasing number of users use electronic devices to capture images. Imaging devices in the art related adopt pixel-cell arrays with fixed structures for imaging.

SUMMARY

According to one aspect of the present disclosure, a control method in an imaging device is provided. The imaging device includes a pixel-cell array, the pixel-cell array includes a plurality of photosensitive pixel-units, each photosensitive pixel-unit of the photosensitive pixel-units includes at least two exposure pixels, the at least two exposure pixels include at least one medium-exposure pixel. The method includes: determining an ambient brightness level of a photographing environment; adjusting a first ratio to be a first value, in response to a brightness level of the photographing environment belonging to a high-level or a low-level, wherein the first ratio indicates a ratio of the at least one medium-exposure pixel in the each photosensitive pixel-unit; and adjusting the first ratio to be a second value, in response to the brightness level of the photographing environment belonging to a medium-level, wherein the low-level, the medium-level, and the high-level are in an ascending order, and the first value is greater than the second value.

According to another aspect of the present disclosure, an electronic device is provided. The electronic device includes: a pixel-cell array, the pixel-cell array includes a plurality of photosensitive pixel-units, each photosensitive pixel-unit of the photosensitive pixel-units includes at least two exposure pixels, the at least two exposure pixels includes at least one medium-exposure pixel; a processor; and a memory, storing a computer program operable on the processor, wherein the computer program, when executed by the processor, implements: determining an ambient brightness level of a photographing environment; adjusting a first ratio to be a first value, in response to a brightness level of the photographing environment belonging to a high-level or a low-level, wherein the first ratio indicates a ratio of the at least one medium-exposure pixel in the each photosensitive pixel-unit; and adjusting the first ratio to be a second value, in response to the brightness level of the photographing environment belonging to a medium-level, wherein the low-level, the medium-level, and the high-level are in an ascending order, and the first value is greater than the second value.

According to yet another aspect of the present disclosure, a non-transitory computer-readable storage medium is provided, which stores a computer program, when executed by a processor, implements: determining an ambient brightness level of a photographing environment; adjusting a first ratio to be a first value, in response to a brightness level of the photographing environment belonging to a high-level or a low-level, wherein the first ratio indicates a ratio of the at least one medium-exposure pixel in the each photosensitive pixel-unit; and adjusting the first ratio to be a second value, in response to the brightness level of the photographing environment belonging to a medium-level, wherein the low-level, the medium-level, and the high-level are in an ascending order, and the first value is greater than the second value.

Additional aspects and advantages of the present disclosure will be partially provided in the following description, and some thereof will become obvious from the following description, or be understood through practice of the present disclosure.

BRIEF DESCRIPTION OF DRAWINGS

In order to more clearly explain technical solutions in embodiments of the present disclosure, the drawings required to be used in the embodiments will be briefly introduced below. Apparently, the drawings in the following description are some embodiments of the present disclosure. Based on these drawings, other drawings can further be obtained by those of ordinary skill in the art without expending inventive labor.

FIG. 6 is a third structural diagram of a photosensitive pixel-unit according to some embodiments of the present disclosure.

FIG. 7 is a flow diagram of a control method according to a second embodiment of the present disclosure.

DETAILED DESCRIPTION

Figure 1:
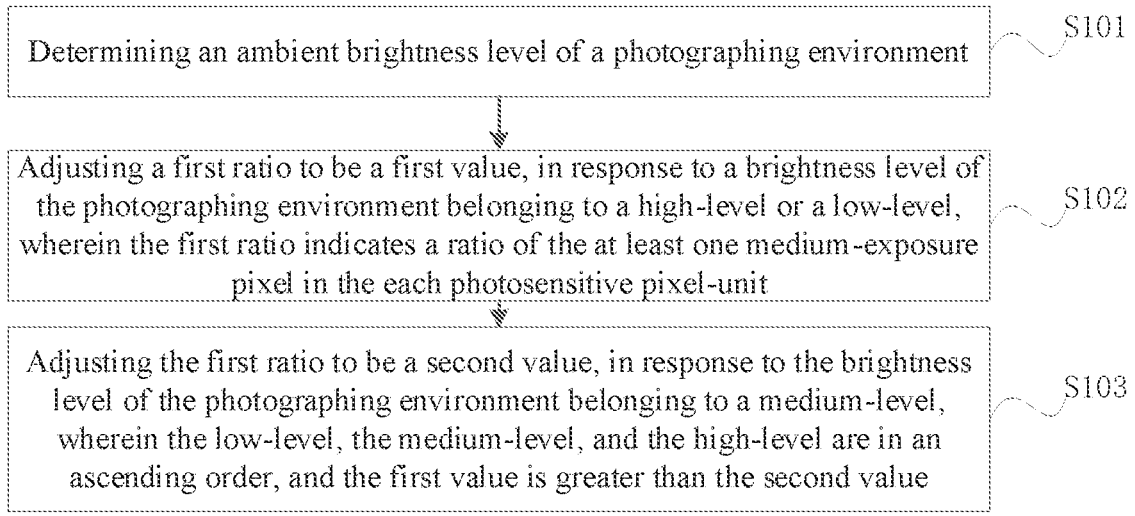
FIG. 1 is a flow diagram of a control method according to a first embodiment of the present disclosure.

The embodiments of the present disclosure are described in detail below. Examples of the embodiments are shown in the accompanying drawings, where identical or similar reference numerals indicate identical or similar elements, or elements with identical or similar functions throughout the present disclosure. The embodiments described below with reference to the accompanying drawings are exemplary, and are intended to interpret the present disclosure, but shall not be construed as limiting the present disclosure.

The present disclosure provides a control method mainly in response to the technical problem concerning poor image quality in the prior art.

The control method in the embodiment of the present disclosure determines a brightness level of ambient brightness, where the brightness level includes a low-level, a medium-level and a high-level arranged in an ascending order of brightness. When a brightness level of photographing environment belongs to the high-level or the low-level, a ratio of medium-exposure pixels in each of the photosensitive pixel-units is adjusted to be a first value; and when the brightness level of the photographing environment belongs to the medium-level, the ratio of medium-exposure pixels in each of the photosensitive pixel-units is adjusted to be a second value, where the first value is greater than the second value. Thus, it is possible to automatically adjust the ratio of medium-exposure pixels in each of the photosensitive pixel-units according to the brightness level of the photographing environment, thereby making it possible to retain more useful information in the shot image and to improve brightness of the shot image and imaging effect and quality, as well as user's shooting experience.

A control method in an imaging device is provided. The imaging device includes a pixel-cell array, the pixel-cell array including a plurality of photosensitive pixel-units, each photosensitive pixel-unit of the photosensitive pixel-units including at least two exposure pixels, the at least two exposure pixels including at least one medium-exposure pixel. The method includes determining an ambient brightness level of a photographing environment; adjusting a first ratio to be a first value, in response to a brightness level of the photographing environment belonging to a high-level or a low-level, wherein the first ratio indicates a ratio of the at least one medium-exposure pixel in the each photosensitive pixel-unit; and adjusting the first ratio to be a second value, in response to the brightness level of the photographing environment belonging to a medium-level, wherein the low-level, the medium-level, and the high-level are in an ascending order, and the first value is greater than the second value.

In some embodiments, the adjusting a first ratio to be a first value includes: switching at least one of a short-exposure pixel and a long-exposure pixel in the each photosensitive pixel-unit to at least one of another medium-exposure pixel, such that the first ratio is increased to be the first value; wherein an exposure duration of a long-exposure pixel is greater than an exposure duration of a medium-exposure pixel, and the exposure duration of the medium-exposure pixel is greater than an exposure duration of a short-exposure pixel.

In some embodiments, the adjusting the first ratio to be a second value includes: switching at least one of the at least one medium-exposure pixel in the each photosensitive pixel-unit to at least one of a short-exposure pixel and a long-exposure pixel, such that the first ratio is reduced to be the second value; wherein an exposure duration of a long-exposure pixel is greater than an exposure duration of a medium-exposure pixel, and the exposure duration of the medium-exposure pixel is greater than an exposure duration of a short-exposure pixel.

In some embodiments, each of the at least two exposure pixels includes a low-exposure photosensitive layer, a medium-exposure photosensitive layer, and a high-exposure photosensitive layer that have different exposure levels; and wherein the method further includes adjusting an arrangement order of a low-exposure photosensitive layer, a medium-exposure photosensitive layer, and a high-exposure photosensitive layer of the at least one of the short-exposure pixel and the long-exposure pixel in a light incident direction and switching the at least one of the short-exposure pixel and the long-exposure pixel to the at least one of another medium-exposure pixel.

In some embodiments, each of the at least two exposure pixels includes a low-exposure photosensitive layer, a medium-exposure photosensitive layer, and a high-exposure photosensitive layer that have different exposure levels; and wherein the method further includes adjusting an arrangement order of a low-exposure photosensitive layer, a medium-exposure photosensitive layer, and a high-exposure photosensitive layer of the at least one of the at least one medium-exposure pixel in a light incident direction and switching the at least one of the at least one medium-exposure pixel to the at least one of the short-exposure pixel and the long-exposure pixel.

In some embodiments, the at least one of the short-exposure pixel and the long-exposure pixel is switched to the at least one of another medium-exposure pixel, in response to the medium-exposure photosensitive layer being located before the low-exposure photosensitive layer and the high-exposure photosensitive layer of the at least one of the short-exposure pixel and the long-exposure pixel.

In some embodiments, the at least one of the at least one medium-exposure pixel is switched to the at least one of the short-exposure pixel and the long-exposure pixel, in response to at least one of the following: the low-exposure photosensitive layer being located before the medium-exposure photosensitive layer and the high-exposure photosensitive layer of the at least one of the at least one medium-exposure pixel; and the high-exposure photosensitive layer being located before the medium-exposure photosensitive layer and the low-exposure photosensitive layer of the at least one of the at least one medium-exposure pixel.

In some embodiments, an exposure duration of the low-exposure photosensitive layer is less than an exposure duration of the medium-exposure photosensitive layer, and the exposure duration of the medium-exposure photosensitive layer is less than an exposure duration of the high-exposure photosensitive layer; or photosensitivity of the low-exposure photosensitive layer is greater than photosensitivity of the medium-exposure photosensitive layer, and the photosensitivity of the medium-exposure photosensitive layer is greater than photosensitivity of the high-exposure photosensitive layer.

In some embodiments, an exposure duration of the low-exposure photosensitive layer is less than an exposure duration of the medium-exposure photosensitive layer, and the exposure duration of the medium-exposure photosensitive layer is less than an exposure duration of the high-exposure photosensitive layer; or photosensitivity of the low-exposure photosensitive layer is greater than photosensitivity of the medium-exposure photosensitive layer, and the photosensitivity of the medium-exposure photosensitive layer is greater than photosensitivity of the high-exposure photosensitive layer.

In some embodiments, the method further includes: controlling the pixel-cell array to output original pixel information, after adjusting the first ratio; obtaining combined pixel information of the each photosensitive pixel-unit according to original pixel information output by the at least two exposure pixels in the each photosensitive pixel-unit; and performing imaging according to the combined pixel information.

In some embodiments, the photographing environment is in a backlit scene; and wherein before the determining an ambient brightness level, the method further includes determining that the photographing environment is in the backlit scene, according to a histogram of a photographed preview image.

In some embodiments, the photographing environment is in a backlit scene; and before the determining an ambient brightness level, the method further includes determining a brightness value of an imaging object and a brightness value of a background of a preview image according to the ambient brightness level measured via the pixel-cell array; and determining that the photographing environment is in the backlit scene, according to the brightness value of the imaging object and the brightness value of the background.

An electronic device is provided. The electronic device includes a pixel-cell array, including a plurality of photosensitive pixel-units, each photosensitive pixel-unit of the photosensitive pixel-units including at least two exposure pixels, the at least two exposure pixels including at least one medium-exposure pixel; and a processor; a memory, storing a computer program operable on the processor, wherein the computer program, when executed by the processor, implements: determining an ambient brightness level of a photographing environment; adjusting a first ratio to be a first value, in response to a brightness level of the photographing environment belonging to a high-level or a low-level, wherein the first ratio indicates a ratio of the at least one medium-exposure pixel in the each photosensitive pixel-unit; and adjusting the first ratio to be a second value, in response to the brightness level of the photographing environment belonging to a medium-level, wherein the low-level, the medium-level, and the high-level are in an ascending order, and the first value is greater than the second value.

In some embodiments, at least one of a short-exposure pixel and a long-exposure pixel in the each photosensitive pixel-unit is switched to at least one of another medium-exposure pixel, such that the first ratio is increased to be the first value; wherein an exposure duration of a long-exposure pixel is greater than an exposure duration of a medium-exposure pixel, and the exposure duration of the medium-exposure pixel is greater than an exposure duration of a short-exposure pixel.

In some embodiments, at least one of the at least one medium-exposure pixel in the each photosensitive pixel-unit is switched to at least one of a short-exposure pixel and a long-exposure pixel, such that the first ratio is reduced to be the second value; wherein an exposure duration of a long-exposure pixel is greater than an exposure duration of a medium-exposure pixel, and the exposure duration of the medium-exposure pixel is greater than an exposure duration of a short-exposure pixel.

In some embodiments, each of the at least two exposure pixels includes a low-exposure photosensitive layer, a medium-exposure photosensitive layer, and a high-exposure photosensitive layer that have different exposure levels; and an arrangement order of a low-exposure photosensitive layer, a medium-exposure photosensitive layer, and a high-exposure photosensitive layer of the at least one of the short-exposure pixel and the long-exposure pixel is adjusted in a light incident direction, such that the at least one of the short-exposure pixel and the long-exposure pixel is switched to the at least one of another medium-exposure pixel.

In some embodiments, each of the at least two exposure pixels includes a low-exposure photosensitive layer, a medium-exposure photosensitive layer, and a high-exposure photosensitive layer that have different exposure levels; and an arrangement order of a low-exposure photosensitive layer, a medium-exposure photosensitive layer, and a high-exposure photosensitive layer of the at least one of the at least one medium-exposure pixel is adjusted in a light incident direction, such that the at least one of the at least one medium-exposure pixel is switched to the at least one of the short-exposure pixel and the long-exposure pixel.

In some embodiments, the at least one of the short-exposure pixel and the long-exposure pixel is switched to the at least one of another medium-exposure pixel, in response to the medium-exposure photosensitive layer being located before the low-exposure photosensitive layer and the high-exposure photosensitive layer of the at least one of the short-exposure pixel and the long-exposure pixel.

In some embodiments, the at least one of the at least one medium-exposure pixel is switched to the at least one of the short-exposure pixel and the long-exposure pixel, in response to at least one of the following: the low-exposure photosensitive layer being located before the medium-exposure photosensitive layer and the high-exposure photosensitive layer of the at least one of the at least one medium-exposure pixel; and the high-exposure photosensitive layer being located before the medium-exposure photosensitive layer and the low-exposure photosensitive layer of the at least one of the at least one medium-exposure pixel.

In some embodiments, an exposure duration of the low-exposure photosensitive layer is less than an exposure duration of the medium-exposure photosensitive layer, and the exposure duration of the medium-exposure photosensitive layer is less than an exposure duration of the high-exposure photosensitive layer; or photosensitivity of the low-exposure photosensitive layer is greater than photosensitivity of the medium-exposure photosensitive layer, and the photosensitivity of the medium-exposure photosensitive layer is greater than photosensitivity of the high-exposure photosensitive layer.

A non-transitory computer-readable storage medium is provided, which stores a computer program, when executed by a processor, implements: determining an ambient brightness level of a photographing environment; adjusting a first ratio to be a first value, in response to a brightness level of the photographing environment belonging to a high-level or a low-level, wherein the first ratio indicates a ratio of the at least one medium-exposure pixel in the each photosensitive pixel-unit; and adjusting the first ratio to be a second value, in response to the brightness level of the photographing environment belonging to a medium-level, wherein the low-level, the medium-level, and the high-level are in an ascending order, and the first value is greater than the second value.

A control method, a control apparatus, an electronic device, and a computer readable storage medium according to the embodiments of the present disclosure are described below with reference to the accompanying drawings.

FIG. 1 is a flow diagram of a control method according to a first embodiment of the present disclosure.

A control method according to some embodiments of the present disclosure is applied to an imaging device. The imaging device includes a pixel-cell array including a plurality of photosensitive pixel-units. Each of the photosensitive pixel-units includes at least two exposure pixels which include at least one medium-exposure pixel.

Figure 2:
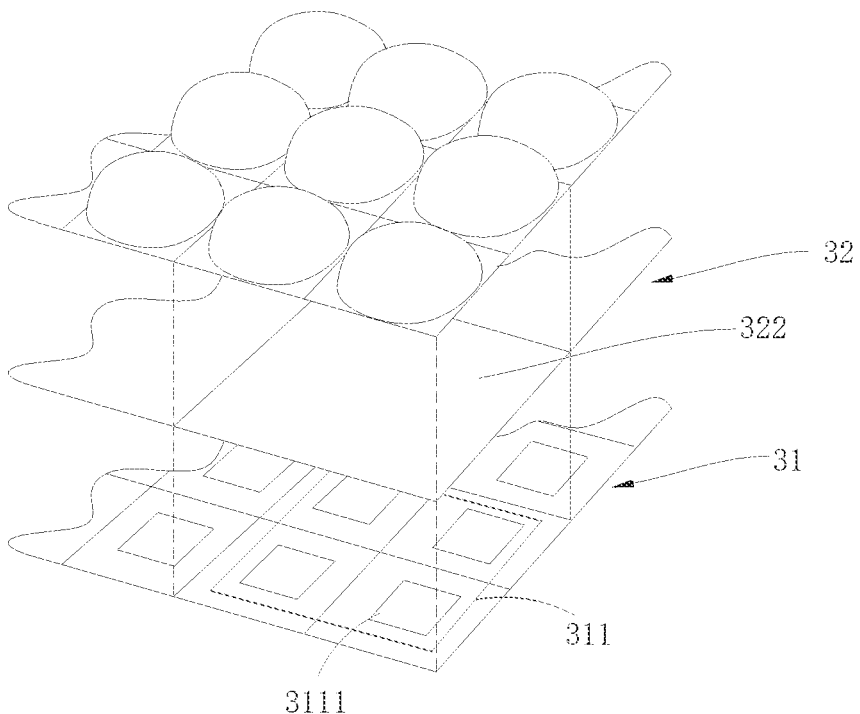
FIG. 2 is a partially structural diagram of a pixel-cell array of an imaging device according to some embodiments of the present disclosure.

By way of example, reference is made to FIG. 2, which is a partially structural diagram of a pixel-cell array of an imaging device according to some embodiments of the present disclosure. An imaging device 30 includes a pixel-cell array 31 and a filter-unit array 32 disposed on the pixel-cell array 31. The pixel-cell array 31 includes a plurality of photosensitive pixel-units 311, where each of the photosensitive pixel-units 311 includes at least two exposure pixels 3111 including at least one medium-exposure pixel. For example, FIG. 2 exemplarily shows that each of the photosensitive pixel-units 311 includes four exposure pixels 3111, where the four exposure pixels may include one long-exposure pixel, two medium-exposure pixels, and one short-exposure pixel. Of course, the number of long-exposure pixels, the number of medium-exposure pixels, and the number of short-exposure pixels in each of the photosensitive pixel-unit 311 can also be other values, which are not limited herein.

The filter-unit array 32 includes a plurality of filter units 322 corresponding to the plurality of photosensitive pixel-units 311. Each of the filter units 322 covers a corresponding photosensitive pixel-unit 311, that is, each exposure pixel contained in a same photosensitive pixel-unit is covered by a filter unit with a same color. The pixel-cell array 31 may be a Bayer array.

The long-exposure pixels mean that corresponding exposure duration of photosensitive pixels is long-exposure duration; the medium-exposure pixels mean that corresponding exposure duration of photosensitive pixels is medium-exposure duration; and short-exposure pixels mean that corresponding exposure duration of photosensitive pixels is short-exposure duration. Therein, the long-exposure duration>the medium-exposure duration>the short-exposure duration, that is, the long-exposure duration of the long-exposure pixels is greater than the medium-exposure duration of the medium-exposure pixels, and the medium-exposure duration of the medium-exposure pixels is greater than the short-exposure duration of the short-exposure pixels. When the imaging device is in operation, the long-exposure pixels, the medium-exposure pixels, and the short-exposure pixels perform synchronous exposure. The synchronous exposure means that the exposure duration of the medium-exposure pixels and the short-exposure pixels is within the exposure duration of the long-exposure pixels.

Specifically, the long-exposure pixels may be first controlled to start exposure first, and then during the exposure period of the long-exposure pixels, the medium-exposure pixels and short-exposure pixels are controlled for exposure. Exposure cut-off time of the medium-exposure pixels and short-exposure pixels should be the same as exposure cut-off time of the long-exposure pixels, or be located before the exposure cut-off time of the long-exposure pixels. Alternatively, the long-exposure pixels, medium-exposure pixels, and short-exposure pixels are controlled to start exposure at the same time, that is, the long-exposure pixels, medium-exposure pixels, and short-exposure pixels are identical in exposure starting time. As such, it is unnecessary to control the pixel-cell array to sequentially perform long exposure, medium exposure, and short exposure, which can reduce image shooting time.

As shown in FIG. 1, the control method includes actions/operations in the following blocks.

At block S101, the method determines an ambient brightness level of a photographing environment.

In the embodiment of the present disclosure, the ambient brightness can be divided into three brightness levels in advance, namely, a low-level, a medium-level, and a high-level. For example, the brightness level can be preset by a built-in program of the electronic device. Alternatively, it may also be set by the user. In this regard, no limitations are made herein.

In the embodiments of the present disclosure, an independent light-measuring device may be adopted to measure the ambient brightness. Alternatively, an ISO value automatically adjusted by a camera can be read, and the ambient brightness can be determined according to the read ISO value. Alternatively, the pixel-cell array can also be controlled to measure an ambient brightness value to determine the ambient brightness.

In this regard, no limitations are made herein. After the ambient brightness is determined, the brightness level may be determined according to the ambient brightness.

It should be noted that, the above ISO value is used to indicate photosensitivity of the camera. Commonly used ISO values are 50, 100, 200, 400, 1000, etc. The camera may automatically adjust the ISO value according to the ambient brightness. Therefore, in the present embodiment, the ambient brightness can be deduced from the ISO value. Generally, in the case of sufficient light, the ISO value can be 50 or 100, and in the case of insufficient light, the ISO value can be 400 or higher.

It should be understood that, when the electronic device is in different scenes, different brightness levels may be configured. For example, when the electronic device is located indoors during the day, the ISO value is between 200 and 500, and when the electronic device is located outdoors during the day, the ISO value is generally lower than 200. Therefore, a size and interval of each brightness level may be configured according to an actual need and a specific shooting scene.

At block S102, the method adjusts a first ratio to be a first value, in response to a brightness level of the photographing environment belonging to a high-level or a low-level, wherein the first ratio indicates a ratio of the at least one medium-exposure pixel in the each photosensitive pixel-unit.

The first value may be preset by a built-in program of the electronic device, or may also be set by the user, which is not limited herein.

In the embodiment of the present disclosure, the long-exposure pixels, medium-exposure pixels, and short-exposure pixels in each of the photosensitive pixel-units are adjustable. When a brightness level of photographing environment belongs to the high-level or the low-level, the photographing environment is shown to be brighter or darker. At this time, the ambient brightness is rather extreme. When the long-exposure pixels or short-exposure pixels are used for shooting, a noise of an output image is higher. Alternatively, pixel information output by the long-exposure pixels or short-exposure pixels may overflow, and image details will be lost more seriously.

For example, according to a Red, Green and Blue (RGB) three-color histogram, detailed content distribution of the three colors with different shades may be displayed intuitively. Overexposed portions will converge at the left and right ends of the histogram. A region beyond the tolerance will not be brighter, but will have all the details lost, with only all-white color blocks (255, 255, 255) displayed. On the contrary, underexposed portions will not be darker beyond the tolerance, but will have all the details lost, with only all-black color blocks (0, 0, 0) displayed.

Therefore, in the present disclosure, in order to retain more image details, it is possible to increase the ratio of medium-exposure pixels. For example, the short-exposure pixels in each of the photosensitive pixel-units may be switched to medium-exposure pixels; or the long-exposure pixels in each of the photosensitive pixel-units may be switched to medium-exposure pixels; or the short-exposure pixels and long-exposure pixels in each of the photosensitive pixel-units may be switched to medium-exposure pixels, thereby increasing the ratio of medium-exposure pixels in the corresponding photosensitive pixel-unit to the first value.

At block S103, the method adjusts the first ratio to be a second value, in response to the brightness level of the photographing environment belonging to a medium-level, wherein the low-level, the medium-level, and the high-level are in an ascending order, and the first value is greater than the second value.

The second value may be preset by a built-in program of the electronic device, or may also be set by the user, which is not limited herein.

In the embodiment of the present disclosure, when the brightness level of the photographing environment belongs to the medium-level, more details of the shot image are retained. Specifically, it is possible to reduce the ratio of medium-exposure pixels. For example, a medium-exposure pixel in each of the photosensitive pixel-units is switched to a short-exposure pixel; or another medium-exposure pixel is switched to a long-exposure pixel; or a medium-exposure pixel in each of the photosensitive pixel-units is switched to a short-exposure pixel, while another medium-exposure pixel is switched to a long-exposure pixel to decrease the ratio of medium-exposure pixels in the corresponding photosensitive pixel-unit to the second value. Therefore, the long-exposure pixels can correct a dark region in the image, and the short-exposure pixels can correct a bright region in the image, which improves the imaging effect and quality.

The control method in the embodiments of the present disclosure determines an ambient brightness level, where the brightness level includes a low-level, a medium-level and a high-level arranged in an ascending order of brightness. When a brightness level of photographing environment belongs to the high-level or the low-level, a ratio of medium-exposure pixels in each of the photosensitive pixel-units is adjusted to be a first value; and when the brightness level of the photographing environment belongs to the medium-level, the ratio of medium-exposure pixels in each of the photosensitive pixel-units is adjusted to be a second value, where the first value is greater than the second value. Thus, it is possible to automatically adjust the ratio of medium-exposure pixels in each of the photosensitive pixel-units according to the brightness level of the photographing environment, thereby making it possible to retain more useful information in the shot image and to improve brightness of the shot image and imaging effect and quality, as well as user's shooting experience.

It should be noted that, in a backlit scene, when the user uses a front camera of the electronic device to take a selfie, since the user is between a light source and the electronic device, it is easy to cause insufficient exposure of the human face. Therefore, in the backlit scene, the shot image has less useful information and lower brightness. In the embodiment of the present disclosure, it is possible to retain more useful information in the shot image and to improve brightness of the shot image, by automatically adjusting the ratio of medium-exposure pixels in each of photosensitive pixel-units according to the brightness level of the photographing environment.

As a possible implementation manner, it may be determined according to the histogram of a shot preview image that the current photographing environment belongs to a backlit scene.

Specifically, when the preview image is taken, it is possible to generate a grayscale histogram according to grayscale values corresponding to the ambient brightness values measured in the pixel-cell array, and then to judge whether the current photographing environment is in a backlit scene according to a ratio of the number of photosensitive pixels in each grayscale range.

For example, when it is determined according to the grayscale histogram that, a ratio grayRatio of photosensitive pixels in the pixel-cell array, whose grayscale values corresponding to the measured ambient brightness values lie in a grayscale range of [0, 20], to all the photosensitive pixels in the pixel-cell array is greater than a first threshold which, for example, can be 0.135, and a ratio grayRatio of photosensitive pixels of the pixel-cell array, whose grayscale values corresponding to the measured ambient brightness values lie in a grayscale range of [200, 256], to all the photosensitive pixels in the pixel-cell array is greater than a second threshold which, for example, can be 0.0899, the current photographing environment is determined to be in a backlit scene.

Alternatively, when it is determined according to the grayscale histogram that, a ratio grayRatio of photosensitive pixels in the pixel-cell array, whose grayscale values corresponding to the measured ambient brightness values lie in a grayscale range of [0, 50], to all the photosensitive pixels in the pixel-cell array is greater than a third threshold which, for example, can be 0.3, and a ratio grayRatio of photosensitive pixels in the pixel-cell array, whose grayscale values corresponding to the measured ambient brightness values lie in a grayscale range of [200, 256], to all the photosensitive pixels in the pixel-cell array is greater than a four threshold which, for example, can be 0.003, the current photographing environment is determined to be in a backlit scene.

Alternatively, when it is determined according to the grayscale histogram that, the ratio grayRatio of photosensitive pixels in the pixel-cell array, whose grayscale value corresponding to the measured ambient brightness values lie in a grayscale range of [0, 50], to all the photosensitive pixels in the pixel-cell array is greater than a fifth threshold which, for example, can be 0.05, and the ratio grayRatio of photosensitive pixels of the pixel-cell array, whose grayscale values corresponding to the measured ambient brightness values lie in a grayscale range of [200, 256], to all the photosensitive pixels in the pixel-cell array is greater than a sixth threshold which, for example, can be 0.25, the current photographing environment is determined to be a backlit scene.

Figure 3:
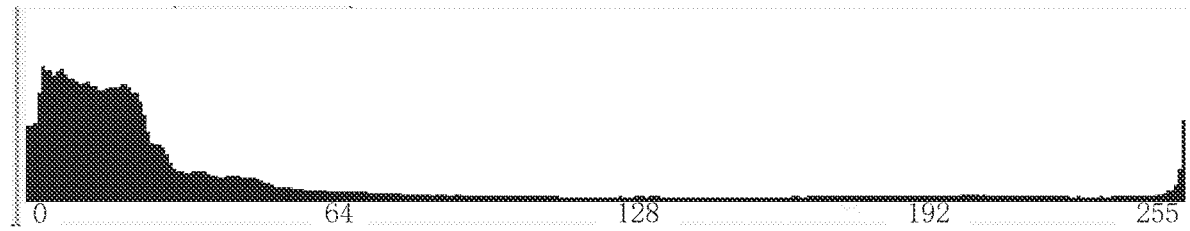
FIG. 3 is a diagram of a grayscale histogram corresponding to a backlit scene according to some embodiments of the present disclosure.

By way of example, a grayscale histogram corresponding to a backlit scene may be as shown in FIG. 3.

It may be understood that, under normal circumstances, when the current photographing environment is a backlit scene, the ambient brightness values measured with the respective photosensitive pixels in the pixel-cell array will largely differ in brightness. Therefore, as another possible implementation manner, it is also possible to determine, from the ambient brightness value measured with the pixel-cell array, a brightness value of an imaging object and a brightness value of the background, and to judge whether a difference between the brightness value of the imaging object and the brightness value of the background is greater than a preset threshold. When the difference between the brightness value of the imaging object and the brightness value of the background is greater than the preset threshold, it is determined that the current photographing environment is in a backlit scene, while the difference between the brightness value of the imaging object and the brightness value of the background is smaller than or equal to the preset threshold, it is determined that the current photographing environment is a non-backlit scene.

The preset threshold may be preset in the built-in program of the electronic device, or the preset threshold may also be set by the user, which is not limited herein. The imaging object is an object that needs to be shot by the electronic device, such as a person (or a human face), an animal, an object, a scene, etc.

As a possible implementation manner, each exposure pixel includes a low-exposure photosensitive layer, a medium-exposure photosensitive layer, and a high-exposure photosensitive layer that have different exposure levels. It is possible to switch an exposure pixel to a medium-exposure pixel, a long-exposure pixel, or a short-exposure pixel, by switching an arrangement order of the low-exposure photosensitive layer, the medium-exposure photosensitive layer and the high-exposure photosensitive layer of the exposure pixel in a light incident direction.

For example, when the brightness level of the photographing environment belongs to the high-level or the low-level, it is possible to switch the short-exposure pixels and/or long-exposure pixels in each of the photosensitive pixel-units to medium-exposure pixels. For example, with reference to FIG. 4, assuming that a photosensitive pixel-unit includes four exposure pixels, namely, one long-exposure pixel (L), two medium-exposure pixels (M), and one short-exposure pixel (S), it is possible to switch the long-exposure pixel and the short-exposure pixel respectively to medium-exposure pixels. Specifically, it is possible to arrange the medium-exposure photosensitive layers of the long-exposure pixel and the short-exposure pixel to be located before the low-exposure photosensitive layer and the high-exposure photosensitive layer, such that the long-exposure pixel and the short-exposure pixel are switched to medium-exposure pixels.

Figure 5:
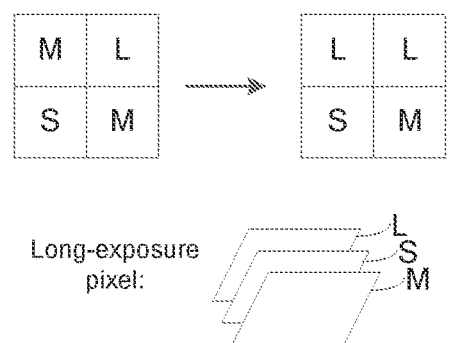
FIG. 5 is a second structural diagram of a photosensitive pixel-unit according to some embodiments of the present disclosure.

When the brightness level of the photographing environment belongs to the medium-level, it is possible to switch one medium-exposure pixel in each of the photosensitive pixel-units to a short-exposure pixel, and/or to switch another medium-exposure pixel to a long-exposure pixel. For example, with reference to FIG. 5, a medium-exposure pixel can be switched to a long-exposure pixel. Specifically, the high-exposure photosensitive layer of the medium-exposure pixel may be arranged to be located before the low-exposure photosensitive layer and the medium-exposure photosensitive layer to switch the medium-exposure pixel to a long-exposure pixel. Alternatively, with reference to FIG. 6, a medium-exposure pixel can be switched to a short-exposure pixel. Specifically, the low-exposure photosensitive layer of the medium-exposure pixel may be arranged to be located before the medium-exposure photosensitive layer and the high-exposure photosensitive layer to switch the medium-exposure pixel to a short-exposure pixel.

An exposure duration of the low-exposure photosensitive layer is less than an exposure duration of the medium-exposure photosensitive layer, and the exposure duration of the medium-exposure photosensitive layer is less than an exposure duration of the high-exposure photosensitive layer. Alternatively, photosensitivity of the low-exposure photosensitive layer is greater than photosensitivity of the medium-exposure photosensitive layer, and the photosensitivity of the medium-exposure photosensitive layer is greater than photosensitivity of the high-exposure photosensitive layer.

As a possible implementation manner, with reference to FIG. 7, based on the embodiment shown in FIG. 1, after the ratio of medium-exposure pixels in each of the photosensitive pixel-units is adjusted, imaging may be performed according to each of the photosensitive pixel-units after the adjustment. In order to clearly illustrate a specific imaging process, the control method may further include the following steps, as shown in FIG. 7.

At block 201, the pixel-cell array may be controlled to output original pixel information, after the ratio of medium-exposure pixels in each of the photosensitive pixel-units of the pixel-cell array is adjusted.

In the embodiments of the present disclosure, after adjusting the ratio of medium-exposure pixels in each of the photosensitive pixel-units, it is possible to control the pixel-cell array to output original pixel information.

As a possible implementation manner, the pixel-cell array may be controlled to output a quantity of original pixel information respectively at different exposure duration. For example, the long-exposure pixels, the medium-exposure pixels, and/or the short-exposure pixels in each of the photosensitive pixel-units in the pixel-cell array may be controlled for synchronous exposure, where exposure duration corresponding to the long-exposure pixels is initial long-exposure duration, exposure duration corresponding to the medium-exposure pixels is initial medium-exposure duration, and exposure duration corresponding to the short-exposure pixels is initial short-exposure duration. The initial long-exposure duration, the initial-medium-exposure duration and initial short-exposure duration are all preset. After the exposure is completed, each of the photosensitive pixel-units in the pixel-cell array will output a quantity of original pixel information respectively lying at different exposure duration.

As another possible implementation manner, the pixel-cell array may also be controlled to output a quantity of original pixel information derived from exposure with identical exposure duration. For example, the long-exposure pixels, the medium-exposure pixels, and/or the short-exposure pixels in each of the photosensitive pixel-units in the pixel-cell array may be controlled for synchronous exposure, where exposure duration of each of the exposure pixels is identical, i.e., exposure cut-off time of the long-exposure pixels, the medium-exposure pixels, and/or the short-exposure pixels is also identical. After the exposure is completed, each of the photosensitive pixel-units in the pixel-cell array will output a quantity of original pixel information derived from exposure with identical exposure duration.

Figure 4:
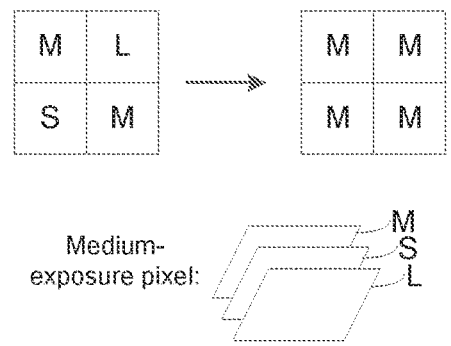
FIG. 4 is a first structural diagram of a photosensitive pixel-unit according to some embodiments of the present disclosure.

For example, with reference to FIG. 4, when each of the photosensitive pixel-units consists of four medium-exposure pixels, each of the photosensitive pixel-units will output four original pixel information, which is original pixel information output by the four medium-exposure pixels, respectively. Alternatively, with reference to FIG. 5, when each of the photosensitive pixel-units includes two long-exposure pixels, one medium-exposure pixel, and one short-exposure pixel, each of the photosensitive pixel-units will output four original pixel information, which is original pixel information output by the two long-exposure pixels, original pixel information output by the one medium-exposure pixel, and original pixel information output by the one short-exposure pixel, respectively.

At block 202, combined pixel information of each of the photosensitive pixel-units may be obtained according to the original pixel information output by at least two exposure pixels in the same photosensitive pixel-unit.

Specifically, the combined pixel information of each of the photosensitive pixel-units may be calculated according to original pixel information with identical exposure duration in the same photosensitive pixel-unit.

As a possible implementation manner, after the pixel-cell array is controlled to output a quantity of original pixel information respectively at different exposure duration, the combined pixel information may be calculated according to original pixel information with identical exposure duration in the same photosensitive pixel-unit.

For example, when each of the photosensitive pixel-units includes one long-exposure pixel, two medium-exposure pixels, and one short-exposure pixel, original pixel information of the only long-exposure pixel is combined pixel information of long exposure; a sum of original pixel information of the two medium-exposure pixels is combined pixel information of medium exposure; and original pixel information of the only short-exposure pixel is combined pixel information of short exposure. When each of the photosensitive pixel-units includes two long-exposure pixels, four medium-exposure pixels and two short-exposure pixels, a sum of original pixel information of the two long-exposure pixels is combined pixel information of long exposure; a sum of original pixel information of the four medium-exposure pixels is combined pixel information of medium exposure; and a sum of original pixel information of the two short-exposure pixels is combined pixel information of short exposure. As such, it is possible to obtain combined pixel information of a quantity of long exposure of the entire pixel-cell array, combined pixel information of a quantity of medium exposure, and combined pixel information of a quantity of short exposure.

Optionally, it is possible to select original pixel information of long-exposure pixels, original pixel information of short-exposure pixels, or original pixel information of medium-exposure pixels in a same photosensitive pixel-unit, and then to calculate combined pixel information according to the selected original pixel information and an exposure ratio between the long-exposure duration, the medium-exposure duration, and the short-exposure duration.

For example, when a photosensitive pixel includes one long-exposure pixel, two medium-exposure pixels, and one short-exposure pixel, and original pixel information of the long-exposure pixel is 80, original pixel information of the two medium-exposure pixels is 255, and original pixel information of the short-exposure pixel is 255, since 255 is an upper limit of the original pixel information, the original pixel information, i.e., 80, of the long-exposure pixel can be selected. Assuming that an exposure ratio between the long-exposure duration, the medium-exposure duration and the short-exposure duration is 16:4:1, the combined pixel information is: 80*16=1280.

Since the upper limit of the original pixel information in the prior art is 255, combined pixel information is calculated according to selected original pixel information and an exposure ratio between the long-exposure duration, the medium-exposure duration and the short-exposure duration, such that it is possible to extend the dynamic range to obtain an image in a high dynamic range, thereby improving imaging effect of the imaging image.

As another possible implementation manner, after the pixel-cell array is controlled to output a quantity of original pixel information derived from exposure with identical exposure duration, an average value of the original pixel information of the same photosensitive pixel-unit can be calculated to obtain combined pixel information. Therein, each of the photosensitive pixel-units corresponds to one combined pixel information.

For example, when a photosensitive pixel-unit includes one long-exposure pixel, two medium-exposure pixels, and one short-exposure pixel, one original pixel information output by the one long-exposure pixel, two original pixel information of the two medium-exposure pixels and one original pixel information of the one short-exposure pixel are marked as R1, R2 and R3, respectively. Thus, combined pixel information of the photosensitive pixel-unit is (R1+R2+R3+R4)/4.

At block 203, imaging may be performed according to the combined pixel information.

In an embodiment of the present disclosure, after combined pixel information is obtained, imaging may be performed according to the combined pixel information.

As a possible implementation manner, when the pixel-cell array is controlled to output a quantity of original pixel information lying respectively at different exposure duration, and after combined pixel information is calculated according to original pixel information with identical exposure duration in the same photosensitive pixel-unit, it is possible to obtain combined pixel information of a quantity of long exposure of the entire pixel-cell array, combined pixel information of a quantity of medium exposure, and combined pixel information of a quantity of short exposure. Then, a long-exposure sub-image is obtained by interpolation calculation based on the combined pixel information of the quantity of long exposure; a medium-exposure sub-image is obtained by interpolation calculation based on the combined pixel information of the quantity of medium exposure, and a short-exposure sub-image is obtained by interpolation calculation based on the combined pixel information of the quantity of short exposure. Finally, the long-exposure sub-image, the medium-exposure sub-image, and the short-exposure sub-image are fused to obtain an imaging image in a high dynamic range. The long-exposure sub-image, the medium-exposure sub-image, and the short-exposure sub-image are not a three-frame image in a traditional sense, but are image portions formed by corresponding regions of the long-exposure, short-exposure, and medium-exposure pixels in a same frame of image.

Alternatively, after the pixel-cell array has its exposure completed, it is possible to superimpose the original pixel information of the short-exposure pixels and the original pixel information of the medium-exposure pixels onto the original pixel information of the long-exposure pixels, based on the original pixel information output by the long-exposure pixels. Specifically, as for a same photosensitive pixel-unit, it is possible to assign different weights to original pixel information with three different exposure duration, respectively; and after the original pixel information corresponding to each exposure duration is multiplied by a respective weight, the three original pixel information multiplied by the weights is added as synthesized pixel information of a photosensitive pixel-unit. Subsequently, since a gray level of each synthesized pixel information calculated based on the original pixel information with the three different exposure duration may vary, it is necessary to compress the gray level of each synthesized pixel information after the synthesized pixel information is obtained. After the compression is completed, an imaging image can be obtained by performing interpolation calculation based on the synthesized pixel information obtained after the compression is completed. In this way, a dark portion of the imaging image has been compensated by the original pixel information output by the long-exposure pixels, and a bright portion has been suppressed by the original pixel information output by the short-exposure pixels. Therefore, the imaging image does not have over-exposed and under-exposed regions and has a higher dynamic range and better imaging effect.

As another possible implementation manner, after controlling the pixel-cell array to output a quantity of original pixel information derived from exposure with identical exposure duration and calculating an average value of the original pixel information of the same photosensitive pixel-unit to obtain combined pixel information, it is possible to determine a quantity of combined pixel information of a plurality of photosensitive pixel-units in the entire pixel-cell array and then to perform interpolation calculation according to the quantity of combined pixel information, thereby making it possible to obtain an imaging image.

In order to implement the above embodiments, the present disclosure further provides a control apparatus.

Figure 8:
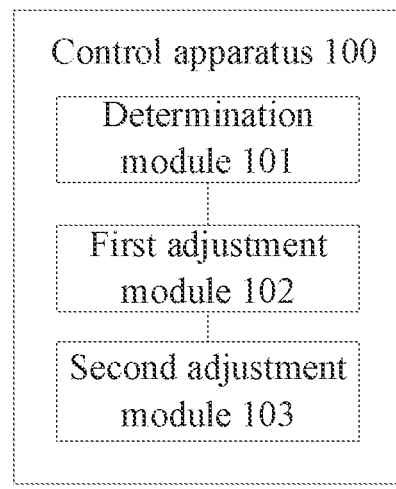
FIG. 8 is a structural diagram of a control apparatus according to a third embodiment of the present disclosure.

FIG. 8 is a structural diagram of a control apparatus according to a third embodiment of the present disclosure.

As shown in FIG. 8, the control apparatus 100 is applied to an imaging device. The imaging device includes a pixel-cell array composed of a plurality of photosensitive pixel-units. Each of the photosensitive pixel-units includes at least two exposure pixels which include at least one medium-exposure pixel. The control apparatus 100 includes a determination module 101, a first adjustment module 102, and a second adjustment module 103.

The determination module 101 is configured to determine an ambient brightness level of a photographing environment.

The first adjustment module 102 is configured to adjust a first ratio to be a first value, in response to a brightness level of the photographing environment belonging to a high-level or a low-level, wherein the first ratio indicates a ratio of the at least one medium-exposure pixel in the each photosensitive pixel-unit.

As a possible implementation manner, the first adjustment module 102 is specifically configured to: switch at least one of a short-exposure pixel and a long-exposure pixel in the each photosensitive pixel-unit to at least one of another medium-exposure pixel, such that the first ratio is increased to be the first value. An exposure duration of a long-exposure pixel is greater than an exposure duration of a medium-exposure pixel, and the exposure duration of a medium-exposure pixel is greater than an exposure duration of a short-exposure pixel.

The second adjustment module 103 is configured to adjust the first ratio to be a second value, in response to the brightness level of the photographing environment belonging to a medium-level, wherein the low-level, the medium-level, and the high-level are in an ascending order, and the first value is greater than the second value.

As a possible implementation manner, the second adjustment module 103 is specifically configured to: switch at least one of the at least one medium-exposure pixel in the each photosensitive pixel-unit to at least one of a short-exposure pixel and a long-exposure pixel, such that the first ratio is reduced to be the second value. An exposure duration of a long-exposure pixel is greater than an exposure duration of a medium-exposure pixel, and the exposure duration of medium-exposure pixel is greater than an exposure duration of a short-exposure pixel.

Figure 9:
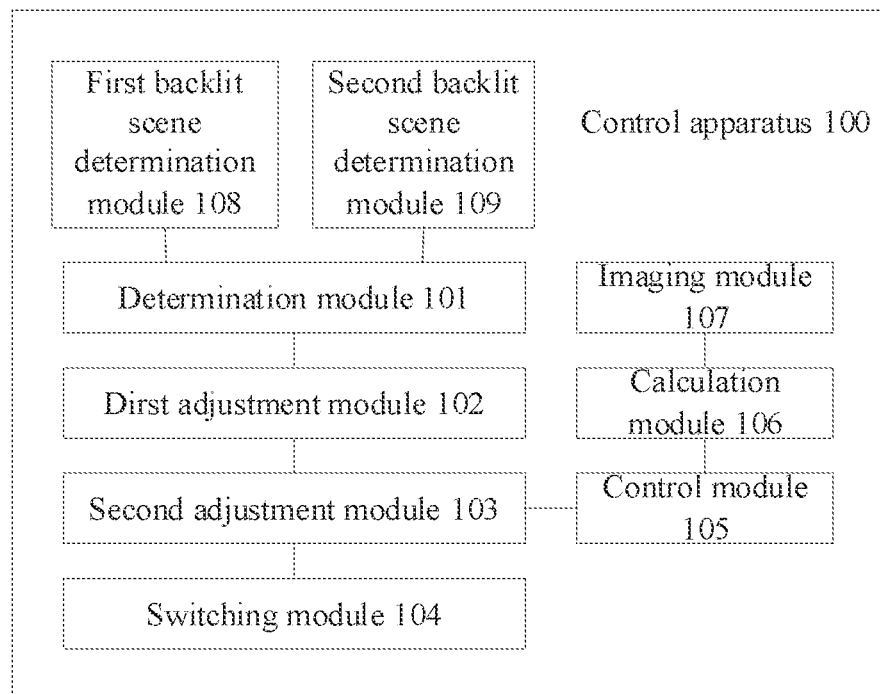
FIG. 9 is a structural diagram of a control apparatus according to a fourth embodiment of the present disclosure.

Further, in a possible implementation manner of the embodiment of the present disclosure, with reference to FIG. 9, the control apparatus 100, based on the embodiment shown in FIG. 8, may further include the following.

As a possible implementation manner, each exposure pixel includes a low-exposure photosensitive layer, a medium-exposure photosensitive layer, and a high-exposure photosensitive layer that have different exposure levels.

A switching module 104 is configured to switch corresponding exposure pixels to medium-exposure pixels, long-exposure pixels, or short-exposure pixels, by switching an arrangement order of the low-exposure photosensitive layer, the medium-exposure photosensitive layer, and the high-exposure photosensitive layer of the corresponding exposure pixels in a light incident direction.

As a possible implementation manner, the switching module 104 is specifically configured to: arrange the low-exposure photosensitive layer to be located before the medium-exposure photosensitive layer and the high-exposure photosensitive layer of a corresponding exposure pixel, such that the corresponding exposure pixel is switched to a short-exposure pixel; arrange the medium-exposure photosensitive layer to be located before the low-exposure photosensitive layer and the high-exposure photosensitive layer of a corresponding exposure pixel, such that the corresponding exposure pixel is switched to a medium-exposure pixel; and arrange the high-exposure photosensitive layer to be located before the low-exposure photosensitive layer and the medium-exposure photosensitive layer of the corresponding exposure pixel, such that the corresponding exposure pixel is switched to a long-exposure pixel.

As a possible implementation manner, an exposure duration of the low-exposure photosensitive layer is less than an exposure duration of the medium-exposure photosensitive layer, and the exposure duration of the medium-exposure photosensitive layer is less than an exposure duration of the high-exposure photosensitive layer. Alternatively, photosensitivity of the low-exposure photosensitivity layer is greater than photosensitivity of the medium-exposure photosensitive layer, and the photosensitivity of the medium-exposure photosensitive layer is greater than photosensitivity of the high-exposure photosensitive layer.

A control module 105 is configured to control the pixel-cell array to output original pixel information after the first ratio.

A calculation module 106 is configured to calculate combined pixel information of each of the photosensitive pixel-units according to original pixel information output by at least two exposure pixels in the same photosensitive pixel-unit.

An imaging module 107 is configured to perform imaging according to the combined pixel information.

A first backlit scene determination module 108 is configured to determine that current photographing environment is in a backlit scene according to a histogram of a shot preview image, before determining the ambient brightness level.

A second backlit scene determination module 109 is configured to determine a brightness value of an imaging object and a brightness value of a background of a preview image according to an ambient brightness value measured with the pixel-cell array, and to determine that the current photographing environment is in the backlight scene according to the brightness value of the imaging object and the brightness value of the background.

It should be noted that, the foregoing explanation of the control method embodiment is also applicable to the control apparatus 100 of the present embodiment, which is not detailed herein.

The control apparatus according to the embodiment of the present disclosure determines a brightness level of ambient brightness, where the brightness level includes a low-level, a medium-level and a high-level arranged in an ascending order of brightness. When a brightness level of photographing environment belongs to the high-level or the low-level, a ratio of medium-exposure pixels in each of the photosensitive pixel-units is adjusted to be a first value; and when the brightness level of the photographing environment belongs to the medium-level, the ratio of medium-exposure pixels in each of the photosensitive pixel-units is adjusted to be a second value. Therein, the first value is greater than the second value. As such, it is possible to automatically adjust the ratio of medium-exposure pixels in each of the photosensitive pixel-units according to the brightness level of the photographing environment, so that more useful information in a shot image can be retained and brightness of the shot image can be improved, thereby improving imaging effect and quality as well as the user's shooting experience.

In order to implement the above-mentioned embodiments, the present disclosure further provides electronic device, including: a pixel-cell array composed of a plurality of photosensitive pixel-units, where each of the photosensitive pixel-units includes at least two exposure pixels including at least one medium-exposure pixel, and further including: a memory, a processor, and a computer program stored on the memory and operable on the processor, where the program, when executed by the processor, implements a control method according to any of the foregoing embodiments of the present disclosure.

In order to implement the above-mentioned embodiments, the present disclosure further provides a non-transitory computer-readable storage medium having stored thereon a computer program which, when executed by a processor, implements a control method according to any of the foregoing embodiments of the present disclosure.

Figure 10:
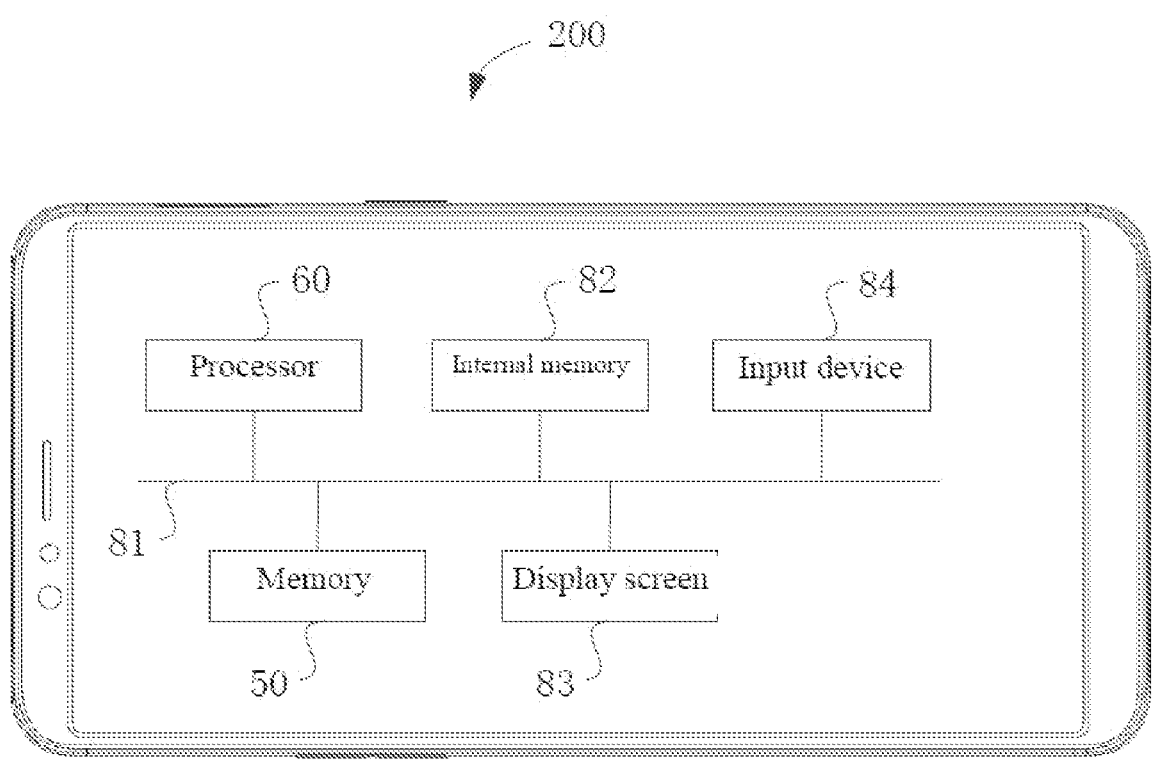
FIG. 10 is a diagram of modules of an electronic device according to some embodiments of the present disclosure.

With reference to FIG. 10, the present disclosure further provides an electronic device 200. The electronic device 200 includes a memory 50 and a processor 60. The memory 50 has stored thereon computer-readable instructions which, when executed by the memory 50, cause the processor 60 to implement a control method according to any one of the foregoing embodiments.

FIG. 10 is a diagram of an internal structure of the electronic device 200 in an embodiment. The electronic device 200 includes a processor 60, a memory 50 (e.g., a non-volatile storage medium), an internal memory 82, a display screen 83, and an input device 84 connected through a system bus 81. Therein, the memory 50 of the electronic device 200 has stored thereon an operating system and computer-readable instructions, where the computer-readable instructions can be executed by the processor 60 to implement the control method of the embodiments of the present disclosure. The processor 60 is configured to provide calculation and control capabilities, to support operation of the entire electronic device 200. The internal memory 82 of the electronic device 200 provides environment for running of the computer-readable instructions in the memory 52. The display screen 83 of the electronic device 200 can be a liquid crystal display screen, an electronic ink display screen, or the like. The input device 84 can be a touch layer covering the display screen 83, or can be a button, a trackball or a touchpad on a housing of the electronic device 200, or can be an external keyboard, a touchpad, a mouse, or the like. The electronic device 200 may be a mobile phone, a tablet computer, a notebook computer, a personal digital assistant, a wearable device (for example, a smart bracelet, a smart watch, a smart helmet, and smart glasses), or the like. Those skilled in the art may understand that, the structure shown in FIG. 10 is only a diagram of part of the structure related to the solution of the present disclosure, and does not constitute a limitation on the electronic device 200 to which the solution of the present disclosure is applied. The specific electronic device 200 may include more or fewer components than shown in the Figure, or have certain components combined, or have a different component arrangement.

Figure 11:
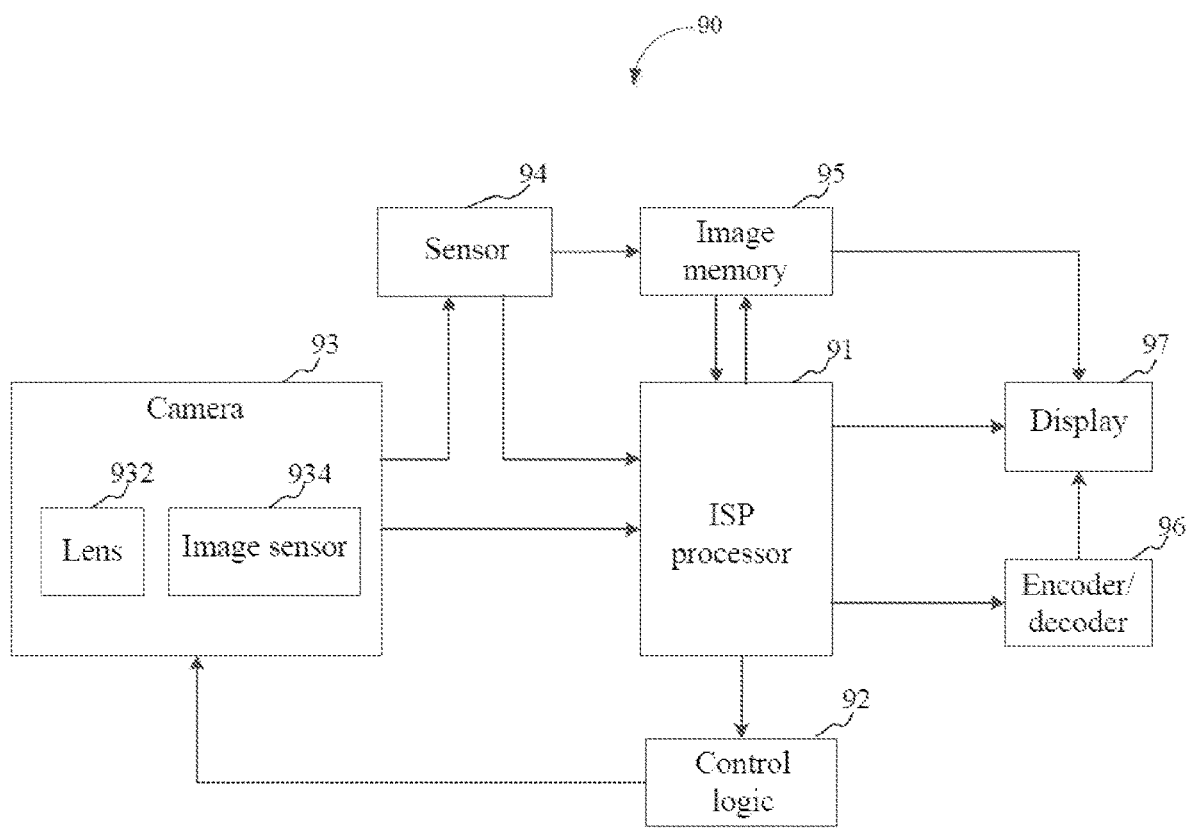
FIG. 11 is a diagram of modules of an image processing circuit according to some embodiments of the present disclosure.

With reference to FIG. 11, the electronic device 200 according to the embodiment of the present disclosure includes an image processing circuit 90. The image processing circuit 90, which can be implemented by hardware and/or software components, includes various processing units defining ISP (Image Signal Processing) pipelines. FIG. 11 is a diagram of the image processing circuit 90 in an embodiment. As shown in FIG. 11, for ease of description, only various aspects of the image processing technology related to the embodiments of the present disclosure are shown.

As shown in FIG. 11, the image processing circuit 90 includes an ISP processor 91 (the ISP processor 91 may be the processor 60) and control logic 92. Image data captured by a camera 93 is first processed by the ISP processor 91 which analyzes the image data to capture image statistical information used to determine one or more control parameters of the camera 93. The camera 93 may include one or more lenses 932 and an image sensor 934. The image sensor 934, which may include a color filter array (e.g., a Bayer filter), may acquire light intensity and wavelength information captured by each imaging pixel, and provide a set of original image data that can be processed by the ISP processor 91. A sensor 94 (e.g., a gyroscope) may provide image processing parameters acquired (e.g., anti-jitter parameters) to the ISP processor 91 based on an interface type of the sensor 94. The sensor 94 interface can be an SMIA (Standard Mobile Imaging Architecture) interface, other serial or parallel camera interface, or a combination of the above interfaces.

In addition, the image sensor 934 may also send the original image data to the sensor 94. The sensor 94 may provide the original image data to the ISP processor 91 based on the interface type of the sensor 94, or the sensor 94 may store the original image data in the image memory 95.

The ISP processor 91 processes the original image data pixel by pixel according to multiple formats. For example, each image pixel may have a bit depth of 8, 10, 12, or 14 bits. The ISP processor 91 may perform one or more image processing operations on the original image data and collect statistical information about the image data. Therein, the image processing operations can be performed according to identical or different bit depth accuracies.

The ISP processor 91 may also receive image data from the image memory 95. For example, the sensor 94 interface sends the original image data to the image memory 95, and the original image data in the image memory 95 is then provided to the ISP processor 91 for processing. The image memory 95 may be the memory 50, a part of the memory 50, a storage means, or an independent dedicated memory within the electronic device, and may include DMA (Direct Memory Access) features.

When receiving the original image data from the image sensor 934 interface, the sensor 94 interface, or the image memory 95, the ISP processor 91 may perform one or more image processing operations, for example, temporal-domain filtering. The processed image data can be sent to the image memory 95 for additional processing before being displayed. The ISP processor 91 receives the processed data from the image memory 95, and performs image data processing on the processed data in the original domain and in RGB and YCbCr color space. The image data having been processed by the ISP processor 91 may be output to a display 97 (the display 97 may include a display screen 83), for viewing by the user and/or further processing by a graphics engine or a GPU (Graphics Processing Unit, graphics processor). In addition, an output of the ISP processor 91 can also be sent to the image memory 95, and the display 97 can read the image data from the image memory 95. In an embodiment, the image memory 95 may be configured to implement one or more frame buffers. Further, the output of the ISP processor 91 may be sent to an encoder/decoder 96 in order to encode/decode the image data. The encoded image data can be saved and decompressed before being displayed on the display 97 device. The encoder/decoder 96 may be implemented by a CPU, a GPU, or a coprocessor.

Statistical data determined by the ISP processor 91 may be sent to the control logic 92 unit. For example, the statistical data may include image sensor 934 statistical information, such as automatic exposure, automatic white balance, automatic focusing, flicker detection, black level compensation, and lens 932 shading correction. The control logic 92 may include a processing element and/or a microcontroller, for executing one or more routines (e.g., firmware), where the one or more routines may determine control parameters of the camera 93 and control parameters of the ISP processor 91 based on the received statistical data. For example, the control parameters of the camera 93 may include sensor 94 control parameters (such as gain, integration time for exposure control, anti-jitter parameters, etc.), camera flash control parameters, lens 932 control parameters (such as focus or zoom focal length), or a combination of these parameters. The ISP control parameters may include gain levels and color correction matrices for automatic white balance and color adjustment (e.g., during RGB processing), and lens 932 shading correction parameters.

For example, the following are steps for implementing the control method using the processor 60 in FIG. 10 or the image processing circuit 90 (which is specifically the ISP processor 91) in FIG. 11:

determining a brightness level of ambient brightness; where the brightness level includes a low-level, a medium-level and a high-level arranged in an ascending order of brightness;

if a brightness level of photographing environment belongs to the high-level or the low-level, adjusting a ratio of medium-exposure pixels in each of the photosensitive pixel-units to be a first value; and if the brightness level of the photographing environment belongs to the medium-level, adjusting the ratio of medium-exposure pixels in each of the photosensitive pixel-units to be a second value, where the first value is greater than the second value.

For another example, the following are steps of implementing the control method using the processor in FIG. 10 or the image processing circuit 90 (which specifically the ISP processor) in FIG. 11:

after adjusting the ratio of medium-exposure pixels in each of the photosensitive pixel-units for the pixel-cell array, controlling the pixel-cell array to output original pixel information;

according to the original pixel information output by at least two exposure pixels in the same photosensitive pixel-unit, calculating combined pixel information of each of the photosensitive pixel-units; and performing imaging based on the combined pixel information.

In the description of this specification, descriptions with reference to the terms "an embodiment", "some embodiments", "example(s)", "specific example(s)", or "some examples" etc. mean specific features, structures, materials, or characteristics described in conjunction with the embodiment(s) or example(s) are included in at least one embodiment or example of the present disclosure. In this specification, illustrative representations of the above-mentioned terms are not necessarily directed to a same embodiment or example. Moreover, the described specific features, structures, materials or characteristics can be combined in any one or more embodiments or examples in an appropriate manner. In addition, those skilled in the art can combine different embodiments or examples, and features of different embodiments or examples described in this specification, without mutual contradiction.

Further, the terms "first" and "second" are used only for descriptive purposes, and shall not be construed as indicating or implying relative importance or implicitly indicating the number of indicated technical features. Therefore, the features defined with "first" and "second" may explicitly or implicitly include at least one of the features. In the description of the present disclosure, "a plurality of" means at least two, such as two, three, etc., unless otherwise specifically defined.

Any process or method description in the flow diagrams or described in other ways herein may be understood as representing a module, segment, or portion of code, which includes one or more executable instructions for implementing the specified logical function(s) or steps of the process. Moreover, the scope of preferred embodiments of the present disclosure includes additional implementation, which may include performing functions in no accordance with the order shown or discussed, for example, in a substantially simultaneous manner or in reverse order according to the functions involved, which should be understood by those skilled in the art to which the embodiments of the present disclosure pertain.

The logic and/or steps represented in the flow diagrams or described in other ways herein, for example, may be considered as a sequenced list of executable instructions for implementing logic functions, and can be specifically embodied in any computer-readable medium, for use by or in connection with the instruction execution system, apparatus or device (such as a computer-based systems, a systems including a processor, or other system that can fetch and execute instructions from the instruction execution system, apparatus, or device). As far as this specification is concerned, a "computer-readable medium" can be any means that contain, store, communicate, propagate or transport the program for use by or in connection with the instruction execution system, apparatus or device. More specific examples (a non-exhaustive list) of the computer-readable medium include the following: an electrical connection (an electronic device) with one or more wirings, a portable computer disk cartridge (a magnetic device), a random access memory (RAM), a read-only memory (ROM), an erasable and programmable read-only memory (EPROM or flash memory), an optical fiber device, and a portable compact disk read-only memory (CDROM). In addition, the computer-readable medium may even be paper on which the program can be printed, or other suitable medium, because it is possible, for example, to perform optical scanning of the paper or other medium, and then to perform editing, interpreting, or perform treatment in other appropriate manner if necessary, to obtain the program which is subsequently stored in the computer memory.

It should be understood that, each part of the present disclosure can be implemented by hardware, software, firmware or a combination thereof. In the foregoing embodiments, multiple steps or methods can be implemented by software or firmware stored in the memory and executed by a suitable instruction execution system. For example, if it is implemented by hardware as in another embodiment, it can be implemented by any one or a combination of the following technologies known in the art: a discrete logic circuit having a logic gate circuit for implementing logic functions on data signals, an application specific integrated circuit with a suitable combinational logic gate circuit, a programmable gate array (PGA), a field programmable gate array (FPGA), etc.

Those of ordinary skill in the art may understand that, all or part of the steps carried in the foregoing embodiment method can be accomplished by relevant hardware instructed by a program, where the program can be stored in a computer-readable storage medium, and when executed, includes one or a combination of the steps of the method embodiments.

Furthermore, the respective functional units in various embodiments of the present disclosure may be integrated into a processing module, or each unit may exist alone physically, or two or more units may be integrated into a module. The above-mentioned integrated module can be implemented in the form of hardware or a software functional module. If the integrated module is implemented in the form of a software function module and sold or used as an independent product, it may also be stored in a computer-readable storage medium.

The storage medium mentioned above may be a read-only memory, a magnetic disk, an optical disk, or the like. Although the embodiments of the present disclosure have been shown and described above, it may be understood that the above-mentioned embodiments are exemplary and shall not be construed as limiting the present disclosure. A person of ordinary skill in the art may make variations, modifications, replacements and transformations of the foregoing embodiments within the scope of the present disclosure.

What is claimed is:

1. A control method for an imaging device, the imaging device comprising a pixel-cell array, the pixel-cell array comprising a plurality of photosensitive pixel-units, each photosensitive pixel-unit of the photosensitive pixel-units comprising at least two exposure pixels, the at least two exposure pixels comprising at least one medium-exposure pixel, the method comprising:
   determining an ambient brightness level of a photographing environment;
   adjusting a first ratio to be a first value, in response to a brightness level of the photographing environment belonging to a high-level or a low-level, wherein the first ratio indicates a ratio of the at least one medium-exposure pixel in the each photosensitive pixel-unit; and
   adjusting the first ratio to be a second value, in response to the brightness level of the photographing environment belonging to a medium-level, wherein the low-level, the medium-level, and the high-level are in an ascending order, and the first value is greater than the second value;
   wherein the adjusting a first ratio to be the first value comprises:
      switching at least one of a short-exposure pixel and a long-exposure pixel in the each photosensitive pixel-unit to at least one of another medium-exposure pixel, such that the first ratio is increased to be the first value;
   wherein an exposure duration of a long-exposure pixel is greater than an exposure duration of a medium-exposure pixel, and the exposure duration of the medium-exposure pixel is greater than an exposure duration of a short-exposure pixel.

2. The control method according to claim 1, wherein the adjusting the first ratio to be the second value comprises:
   switching at least one of the at least one medium-exposure pixel in the each photosensitive pixel-unit to at least one of a short-exposure pixel and a long-exposure pixel, such that the first ratio is reduced to be the second value;
   wherein an exposure duration of a long-exposure pixel is greater than an exposure duration of a medium-exposure pixel, and the exposure duration of the medium-exposure pixel is greater than an exposure duration of a short-exposure pixel.

3. The control method according to claim 2, wherein each of the at least two exposure pixels comprises a low-exposure photosensitive layer, a medium-exposure photosensitive layer, and a high-exposure photosensitive layer that have different exposure levels; and
   wherein the method further comprises:
      adjusting an arrangement order of a low-exposure photosensitive layer, a medium-exposure photosensitive layer, and a high-exposure photosensitive layer of the at least one of the at least one medium-exposure pixel in a light incident direction and switching the at least one of the at least one medium-exposure pixel to the at least one of the short-exposure pixel and the long-exposure pixel.

4. The control method according to claim 3, wherein the at least one of the at least one medium-exposure pixel is switched to the at least one of the short-exposure pixel and the long-exposure pixel, in response to at least one of the following:
   the low-exposure photosensitive layer being located before the medium-exposure photosensitive layer and the high-exposure photosensitive layer of the at least one of the at least one medium-exposure pixel; and
   the high-exposure photosensitive layer being located before the medium-exposure photosensitive layer and the low-exposure photosensitive layer of the at least one of the at least one medium-exposure pixel.

5. The control method according to claim 3, wherein an exposure duration of the low-exposure photosensitive layer is less than an exposure duration of the medium-exposure photosensitive layer, and the exposure duration of the medium-exposure photosensitive layer is less than an exposure duration of the high-exposure photosensitive layer; or
   photosensitivity of the low-exposure photosensitive layer is greater than photosensitivity of the medium-exposure photosensitive layer, and the photosensitivity of the medium-exposure photosensitive layer is greater than photosensitivity of the high-exposure photosensitive layer.

6. The control method according to claim 1, wherein each of the at least two exposure pixels comprises a low-exposure photosensitive layer, a medium-exposure photosensitive layer, and a high-exposure photosensitive layer that have different exposure levels; and
   wherein the method further comprises:
      adjusting an arrangement order of a low-exposure photosensitive layer, a medium-exposure photosensitive layer, and a high-exposure photosensitive layer of the at least one of the short-exposure pixel and the long-exposure pixel in a light incident direction and switching the at least one of the short-exposure pixel and the long-exposure pixel to the at least one of another medium-exposure pixel.

7. The control method according to claim 6, wherein the at least one of the short-exposure pixel and the long-exposure pixel is switched to the at least one of another medium-exposure pixel, in response to the medium-exposure photosensitive layer being located before the low-exposure photosensitive layer and the high-exposure photosensitive layer of the at least one of the short-exposure pixel and the long-exposure pixel.

8. The control method according to claim 6, wherein an exposure duration of the low-exposure photosensitive layer is less than an exposure duration of the medium-exposure photosensitive layer, and the exposure duration of the medium-exposure photosensitive layer is less than an exposure duration of the high-exposure photosensitive layer; or
    photosensitivity of the low-exposure photosensitive layer is greater than photosensitivity of the medium-exposure photosensitive layer, and the photosensitivity of the medium-exposure photosensitive layer is greater than photosensitivity of the high-exposure photosensitive layer.

9. The control method according to claim 1, further comprising:
    controlling the pixel-cell array to output original pixel information, after adjusting the first ratio;
    obtaining combined pixel information of the each photosensitive pixel-unit according to original pixel information output by the at least two exposure pixels in the each photosensitive pixel-unit; and
    performing imaging according to the combined pixel information.

10. The control method according to claim 1, wherein the photographing environment is in a backlit scene; and
    wherein before the determining an ambient brightness level, the method further comprises:
    determining that the photographing environment is in the backlit scene, according to a histogram of a photographed preview image.

11. The control method according to claim 1, wherein the photographing environment is in a backlit scene; and
    the method further comprises:
    before the determining an ambient brightness level:
    determining a brightness value of an imaging object and a brightness value of a background of a preview image according to the ambient brightness level measured via the pixel-cell array; and
    determining that the photographing environment is in the backlit scene, according to the brightness value of the imaging object and the brightness value of the background.

12. An electronic device, comprising:
    a pixel-cell array, comprising a plurality of photosensitive pixel-units, each photosensitive pixel-unit of the photosensitive pixel-units comprising at least two exposure pixels, the at least two exposure pixels comprising at least one medium-exposure pixel;
    a processor; and
    a memory, storing a computer program operable on the processor, wherein the computer program, when executed by the processor, implements:
    determining an ambient brightness level of a photographing environment;
    adjusting a first ratio to be a first value, in response to a brightness level of the photographing environment belonging to a high-level or a low-level, wherein the first ratio indicates a ratio of the at least one medium-exposure pixel in the each photosensitive pixel-unit; and
    adjusting the first ratio to be a second value, in response to the brightness level of the photographing environment belonging to a medium-level, wherein the low-level, the medium-level, and the high-level are in an ascending order, and the first value is greater than the second value;
    wherein at least one of the at least one medium-exposure pixel in the each photosensitive pixel-unit is switched to at least one of a short-exposure pixel and a long-exposure pixel, such that the first ratio is reduced to be the second value;
    wherein an exposure duration of a long-exposure pixel is greater than an exposure duration of a medium-exposure pixel, and the exposure duration of the medium-exposure pixel is greater than an exposure duration of a short-exposure pixel.

13. The electronic device according to claim 12, wherein at least one of a short-exposure pixel and a long-exposure pixel in the each photosensitive pixel-unit is switched to at least one of another medium-exposure pixel, such that the first ratio is increased to be the first value;
    wherein an exposure duration of a long-exposure pixel is greater than an exposure duration of a medium-exposure pixel, and the exposure duration of the medium-exposure pixel is greater than an exposure duration of a short-exposure pixel.

14. The electronic device according to claim 13, wherein each of the at least two exposure pixels comprises a low-exposure photosensitive layer, a medium-exposure photosensitive layer, and a high-exposure photosensitive layer that have different exposure levels; and
    an arrangement order of a low-exposure photosensitive layer, a medium-exposure photosensitive layer, and a high-exposure photosensitive layer of the at least one of the short-exposure pixel and the long-exposure pixel is adjusted in a light incident direction, such that the at least one of the short-exposure pixel and the long-exposure pixel is switched to the at least one of another medium-exposure pixel.

15. The electronic device according to claim 14, wherein the at least one of the at least one medium-exposure pixel is switched to the at least one of the short-exposure pixel and the long-exposure pixel, in response to at least one of the following:
    the low-exposure photosensitive layer being located before the medium-exposure photosensitive layer and the high-exposure photosensitive layer of the at least one of the at least one medium-exposure pixel; and
    the high-exposure photosensitive layer being located before the medium-exposure photosensitive layer and the low-exposure photosensitive layer of the at least one of the at least one medium-exposure pixel.

16. The electronic device according to claim 12, wherein each of the at least two exposure pixels comprises a low-exposure photosensitive layer, a medium-exposure photosensitive layer, and a high-exposure photosensitive layer that have different exposure levels; and
    an arrangement order of a low-exposure photosensitive layer, a medium-exposure photosensitive layer, and a high-exposure photosensitive layer of the at least one of the at least one medium-exposure pixel is adjusted in a light incident direction, such that the at least one of the at least one medium-exposure pixel is switched to the at least one of the short-exposure pixel and the long-exposure pixel.

17. The electronic device according to claim 12, wherein the at least one of the short-exposure pixel and the long-exposure pixel is switched to the at least one of another medium-exposure pixel, in response to the medium-exposure photosensitive layer being located before the low-exposure photosensitive layer and the high-exposure photosensitive layer of the at least one of the short-exposure pixel and the long-exposure pixel.

18. A non-transitory computer-readable storage medium, storing a computer program, when executed by a processor, implements:

determining an ambient brightness level of a photographing environment;

adjusting a first ratio to be a first value, in response to a brightness level of the photographing environment belonging to a high-level or a low-level, wherein the first ratio indicates a ratio of the at least one medium-exposure pixel in the each photosensitive pixel-unit; and adjusting the first ratio to be a second value, in response to the brightness level of the photographing environment belonging to a medium-level, wherein the low-level, the medium-level, and the high-level are in an ascending order, and the first value is greater than the second value;

wherein the adjusting a first ratio to be the first value comprises:

switching at least one of a short-exposure pixel and a long-exposure pixel in the each photosensitive pixel-unit to at least one of another medium-exposure pixel, such that the first ratio is increased to be the first value;

wherein an exposure duration of a long-exposure pixel is greater than an exposure duration of a medium-exposure pixel, and the exposure duration of the medium-exposure pixel is greater than an exposure duration of a short-exposure pixel.

* * * * *